United States Patent [19]

Futsuhara et al.

[11] Patent Number: 5,568,059
[45] Date of Patent: Oct. 22, 1996

[54] CURRENT SENSOR AND MOTOR ROTATION SENSOR USING SUCH CURRENT SENSOR

[75] Inventors: Koichi Futsuhara; Masayoshi Sakai, both of Saitama-ken, Japan

[73] Assignee: The Nippon Signal Co., Ltd., Japan

[21] Appl. No.: 343,608

[22] PCT Filed: Apr. 1, 1993

[86] PCT No.: PCT/JP93/00419

§ 371 Date: Nov. 30, 1994

§ 102(e) Date: Nov. 30, 1994

[87] PCT Pub. No.: WO94/23307

PCT Pub. Date: Oct. 13, 1994

[51] Int. Cl.$^6$ ........................................ G01R 31/34
[52] U.S. Cl. .................. 324/772; 340/648; 324/127
[58] Field of Search .............. 324/117 H, 127, 324/772; 340/648; 361/23, 30, 31

[56] References Cited

U.S. PATENT DOCUMENTS

| | | | |
|---|---|---|---|
| 3,500,195 | 3/1970 | Specht | 324/127 |
| 3,702,939 | 11/1972 | Darrow | 324/127 |
| 3,846,688 | 11/1974 | Perloff | 324/772 |
| 4,482,862 | 11/1984 | Leehey | 324/127 |
| 4,661,880 | 4/1987 | Futsuhara . | |
| 4,757,417 | 7/1988 | Futsuhara . | |
| 4,789,834 | 12/1988 | Koopman | 324/772 |
| 5,027,114 | 6/1991 | Kawashima et al. . | |

FOREIGN PATENT DOCUMENTS

| | | |
|---|---|---|
| 57-50664 | 3/1982 | Japan . |
| 63-131070 | 6/1988 | Japan . |

OTHER PUBLICATIONS

Koicha Futsuhara, Fail–Safe Circuit Design Know How, Transistor Technology, Feb. 1985, 425–434.

Primary Examiner—Ernest F. Karlsen
Assistant Examiner—Russell M. Kobert
Attorney, Agent, or Firm—Finnegan, Henderson, Farabow, Garrett & Dunner, L.L.P.

[57] ABSTRACT

The present invention relates to a current sensor for detecting current flowing in a current line, and a motor rotation sensor which utilizes this current sensor. A first transformer is inserted in a current line which is connected in parallel with a motor, so that a high frequency signal generated by a signal generator is transmitted to the current line by means of the first transformer. This high frequency signal is extracted by a second transformer inserted into another current line, and is transmitted to a receiver. When the motor rotates due to switching on a switch, or rotates under inertia immediately after switching off the switch, the transformer which is provided with a saturable magnetic body core (one or both of the transformers) becomes saturated due to the current supply to the motor, or the current generated by the motor, so that the level of the high frequency signal transmitted to the receiver drops considerably, causing the output of the receiver to become a logic value of 0 (indicating rotation of the motor). Moreover, when the motor is stopped, since the transformer is no longer saturated the level of the high frequency signal transmitted to the receiver becomes a high level. An output of logic value 1 (indicating that the motor has stopped) is thus produced from the receiver. When a fault such as a disconnection fault occurs in the motor power line, the output of the receiver becomes an output of logic value 0, the same as for motor rotation (indicating danger), thus giving a fail safe construction.

5 Claims, 4 Drawing Sheets

5,568,059

CURRENT SENSOR AND MOTOR ROTATION SENSOR USING SUCH CURRENT SENSOR

TECHNICAL FIELD

A first aspect of the present invention relates to a current sensor for detecting current flowing in a current line. A second aspect of the present invention relates to a motor rotation sensor which utilizes such current sensor, for detecting whether or not a motor is rotating (including rotation under inertia).

BACKGROUND ART

FIG. 1 illustrates an example of a conventional current sensor applied to sensing rotation of a motor. The operation of this sensor is as follows.

The current sensor is constructed such that a high frequency signal generated by a signal generator 2 is transmitted from the primary winding N1 of a transformer T to the secondary winding N2 which is formed from a portion of a motor 1 current line, and is also transmitted through the tertiary winding N3 to a receiver R0. When a current flows in the motor drive circuit which comprises a power source E a switch SW and the motor 1, then the core C of the transformer T which is made from a saturable magnetic body, becomes saturated causing a drop in the level of the high frequency signal transmitted to the receiver R0 side. Hence the output of the receiver R0 which comprises an amplifier 3, an envelope detector 4 and a level tester 5, becomes an output condition of logic value 0 indicating that the motor is rotating. When a current does not flow in the motor drive circuit, then the core C no longer becomes saturated so that the high frequency signal is transmitted to the receiver R0 side without a drop in level. Consequently the output from the receiver R0 becomes an output condition of logic value 1 indicating that the motor is stopped. Moreover, a resistor R is provided in parallel with the motor 1, so that while the motor 1 is rotating under inertia immediately after switching off the switch SW, the current generated in the motor 1 flows through the transformer T via the resistor R and the transformer T becomes saturated. Thereby, also when the motor 1 is rotating under inertia, a signal of logic value 0 indicating that the motor 1 is rotating is produced from the receiver R0.

The abovementioned conventional current sensor however has the disadvantage in that, since if a disconnection fault occurs in the resistor R this cannot be detected, there is the possibility of erroneous generation of an output indicating that the motor is stopped, from the receiver R0 when the motor is still rotating under inertia.

Other methods for detecting whether or not a motor is rotating are the method wherein a drilled rotation disc for example is attached to the rotor of the motor, and rotation of the disc is detected using a light projector and receiver fitted on either side of the disc at the location of the aperture (the general method based on an encoder), or the method based on a tachometer generator.

The motor rotation detection methods based on an encoder or a tachometer generator however both extract a rotation output signal. Therefore, devices other than a device which is required to rotate the motor are required. For example with the encoder method a projector and receiver, and a disc for operating the projector and receiver are required, while with the tachometer generator method, a winding for power generation is required inside the motor.

It is a first object of the present invention to provide a current sensor which can, in the event of a fault occurring in a lead carrying a current being detected, reliably detect this fault. Moreover it is a second object of the present invention to provide a motor rotation sensor which can detect motor rotation without using any device which does not participate with the motor rotation.

DISCLOSURE OF THE INVENTION

In view of these objects, the current sensor of a first aspect of the present invention comprises; a first transformer with a secondary side winding formed from a portion of a current line through which a current passes, a transmitting device for transmitting an alternating current signal to the current line by way of the first transformer, a second transformer provided separately from the first transformer with a primary side winding formed from a portion of said current line, and a receiving device for receiving by way of the second transformer, the alternating current signal transmitted to the current line from the transmitting device, and generating an output of logic value 1 when the received signal level is higher than a predetermined level, wherein at least one of cores of the first transformer and the second transformer comprises a saturable magnetic body core.

With such a construction, the transformer for transmitting the alternating current signal to the current line, and the transformer which extracts the alternating current signal from the current line are arranged separately so that fault of the current line can be reliably detected.

Moreover, if the receiving device is constructed so that the output becomes a logic value 0 at the time of a fault, then it is possible to provided a fail-safe current sensor wherein the output becomes a logic value 0 at the time of a fault.

The motor rotation sensor using the current sensor according to a second aspect of the present invention is constructed such that a motor circuit has a series connected power source, motor, and switch device for switching current to the motor on and off, and a current line is provided in series with the switch device and in parallel with the motor, the first transformer of the current sensor is inserted into the current line, the transmitting device transmits an alternating current signal by way of the first transformer to the current line, the second transformer of the current sensor is inserted in another current line than the current line, the current line and the another current line constituting a closed circuit including the motor when the switch device is switched off, and a receiving device receives by way of the second transformer, the alternating current signal transmitted from the transmitting device, and generates an output signal of logic value 1 indicating that the motor rotation has stopped, when the received signal level is higher than a predetermined level.

With such a construction, motor rotation can be monitored without fitting a device for sensing, directly to the rotor of the motor or to the motor. Moreover the fact that the rotor of the motor has stopped can be monitored in a fail safe manner.

Furthermore, if a resistor is inserted in series with the first transformer, then the transformer can be made smaller.

BEST MODE FOR CARRYING OUT THE INVENTION

As follows is a detailed description of one embodiment of the present invention with reference to the drawings.

Figure 2:
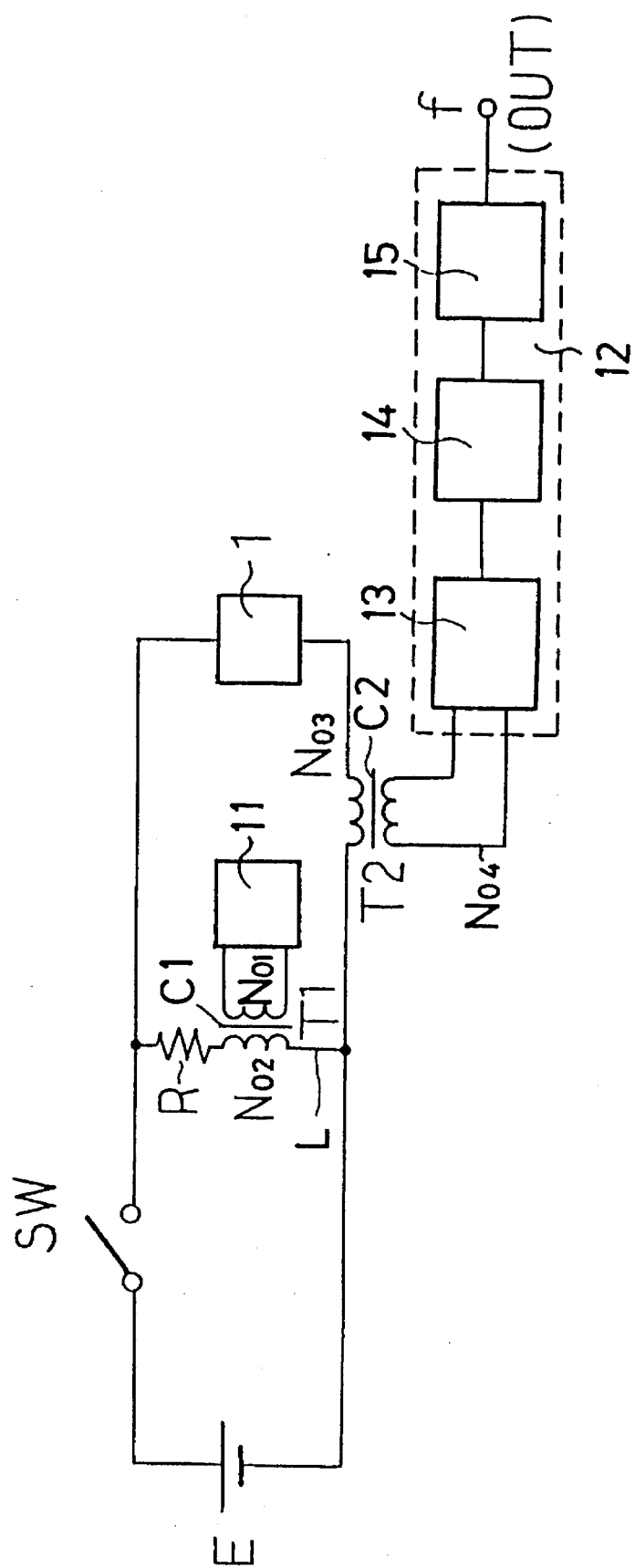
FIG. 2 is a circuit diagram illustrating the construction of current sensor utilized for one embodiment of a motor rotation sensor, according to the present invention.

FIG. 2 shows an embodiment of a motor rotation sensor using a current sensor, according to the present invention.

In FIG. 2, a motor drive circuit, as with the conventional circuit, has a motor drive power source E, a motor 1 such as a direct current motor, and a switch SW are connected in series. The motor drive circuit includes a current line L which is connected to the motor drive source E when the switch SW is an on position and disconnected from the motor drive power source E when the switch SW is an off position. As shown in FIG. 2, the current line L is connected in parallel with the motor 1 with respect to the motor drive power source E, and a resistor R is inserted in the current line L.

A first transformer T1 with a secondary side winding N02 formed from a portion of the current line L is inserted in series with the resistor R. A primary side winding N01 of the first transformer T1 is connected to a signal generator 11 which constitutes a transmitting device for generating a high frequency signal. The high frequency signal from the signal generator 11 is transmitted to the current line L by way of the first transformer T1. Moreover, a second transformer T2 is inserted in the current line which is part other than the current line L of the closed circuit including the motor 1 which is created by the current line L when the switch SW is switched off, such that a primary side winding N03 constitutes a portion of this current line. A secondary side winding N04 of the second transformer T2 is connected to an alternating current amplifier 13 of a receiver 12 which constitutes a receiving device, so that the high frequency signal transmitted to the current line L, is transmitted by way of the second transformer T2 to the receiver 12. Moreover the cores of both the first transformer T1 and the second transformer T2 comprise saturable magnetic body cores C1, C2.

The receiver 12 comprises an alternating current amplifier 13, an envelope detector 14 for envelope detecting the alternating current amplified signal from the alternating current amplifier 13, and a level tester 15 for level testing the signal which has been envelope detected by the envelope detector 14. The alternating current amplifier 13 has a fail-safe AC amplifier construction such that when there is a fault, the output level is fixed. The alternating current amplified output from the alternating current amplifier 13 is envelope detected and rectified. By using a fail-safe level tester wherein when there is a fault the output becomes logic value 0 (output signal goes to zero) as the level tester 15, the receiver 12 becomes a fail-safe receiver which gives an output of logic value 0 (output signal goes to zero) when there is a fault.

The operation of the motor rotation sensor will now be described.

At first when the switch SW is switched off, and once the motor 1 has stopped rotating, that is, when there is no current flow in the motor 1 as well as in the resistor R, the high frequency output current signal of the signal generator 11 flows, by way of the secondary side winding N02 of the first transformer T1, in the closed circuit formed by the resistor R, the motor 1, and the primary side winding N03 of the second transformer T2. This high frequency current signal is extracted by the secondary side winding N04 from the primary side winding N03 of the second transformer T2, amplified by the alternating current amplifier 13 of the receiver 12, and then rectified by the envelope detector 14. The rectified output level at this time is higher than the threshold value of the level tester 15. Therefore the output signal f of the level tester 15 becomes a logic value 1 (f=1) indicating that the motor 1 is stopped.

Then, when the switch SW is switched on, a current is supplied through the switch SW from the motor drive power source E so that the motor 1 rotates. As well as this, a current flows in the resistor R, the secondary side winding N02 of the first transformer T1, and the primary side winding N03 of the second transformer T2,. As a result, the saturable magnetic body cores C1, C2 of the first and second transformers T1, T2 become saturated. Consequently the first and second transformers T1, T2 attain a saturated condition, and the high frequency signal transmitted from the primary side winding N01 to the secondary side winding N04 drops considerably, causing a significant drop in the output signal of the envelope detector 4 to below the threshold value of the level tester 15. As a result, the output signal f of the level tester 15 ceases, becoming f=0 indicating that the motor 1 is rotating.

Consideration is now made of the situation immediately after the switch SW is switched off. Since the motor 1 continues to rotate under inertia, it becomes a generator so that a current continues to flow through the current line of the closed circuit formed by the resistor R, the winding N02, the winding N03, and the motor 1. Due to this current, the first and second transformers T1, T2 remain in the saturated condition, the same as when the switch SW is on, so that the output signal of the level tester 15 remains at f=0. After the period of current flow due to inertial rotation of the motor 1, the current flow ceases so that the saturated condition of the first and second transformers T1, T2 is lost. The high frequency current signal from the signal generator 11 is thus transmitted from the winding N01 to the winding N04 with practically no reduction through the first and second transformers T1, T2. The output signal f of the level tester 15 thus becomes f=1 indicating that the motor 1 has stopped.

The structural theory of the motor rotation sensor of FIG. 2 will now be described.

The reason for providing the current line L in parallel with the motor 1 is as follows. If the current line L is not present, then when the switch SW is switched off, there will be no current line to take the output current accompanying motor rotation. Consequently, when the motor rotates under inertia, there will be no current flow to detect the motor rotation so that rotation monitoring using current detection is not possible. While it is not necessarily required to have the resistor R in the current line L, since if there is no resistor R, a very large transformer becomes necessary, in general the resistor R is inserted.

Figure 3:
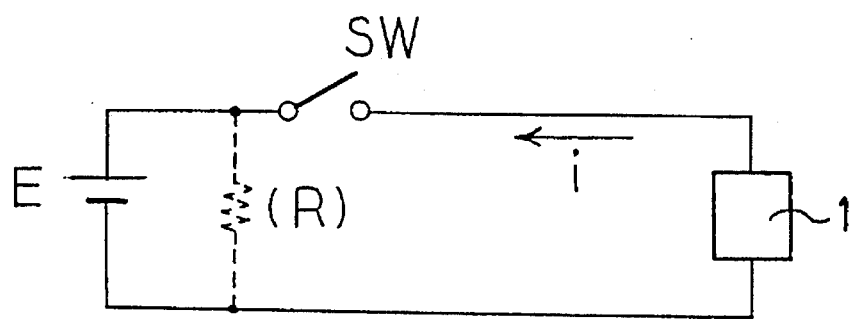
FIG. 3 is a diagram for explaining an effect of the present embodiment.

Furthermore, the connection point of the current line L when viewed from the motor drive power source E must always be to the motor 1 side from the switch SW. For example if as shown by the dotted line of FIG. 3, the connection point is to the motor drive power source E side, then when the switch SW is switched off, the current generated under inertial rotation of the motor 1 will not flow in the resistor R.

The reason for providing two transformers T1, T2 at separate locations, instead of the one transformer for current detection as with the conventional current sensor, is as follows.

Figure 1:
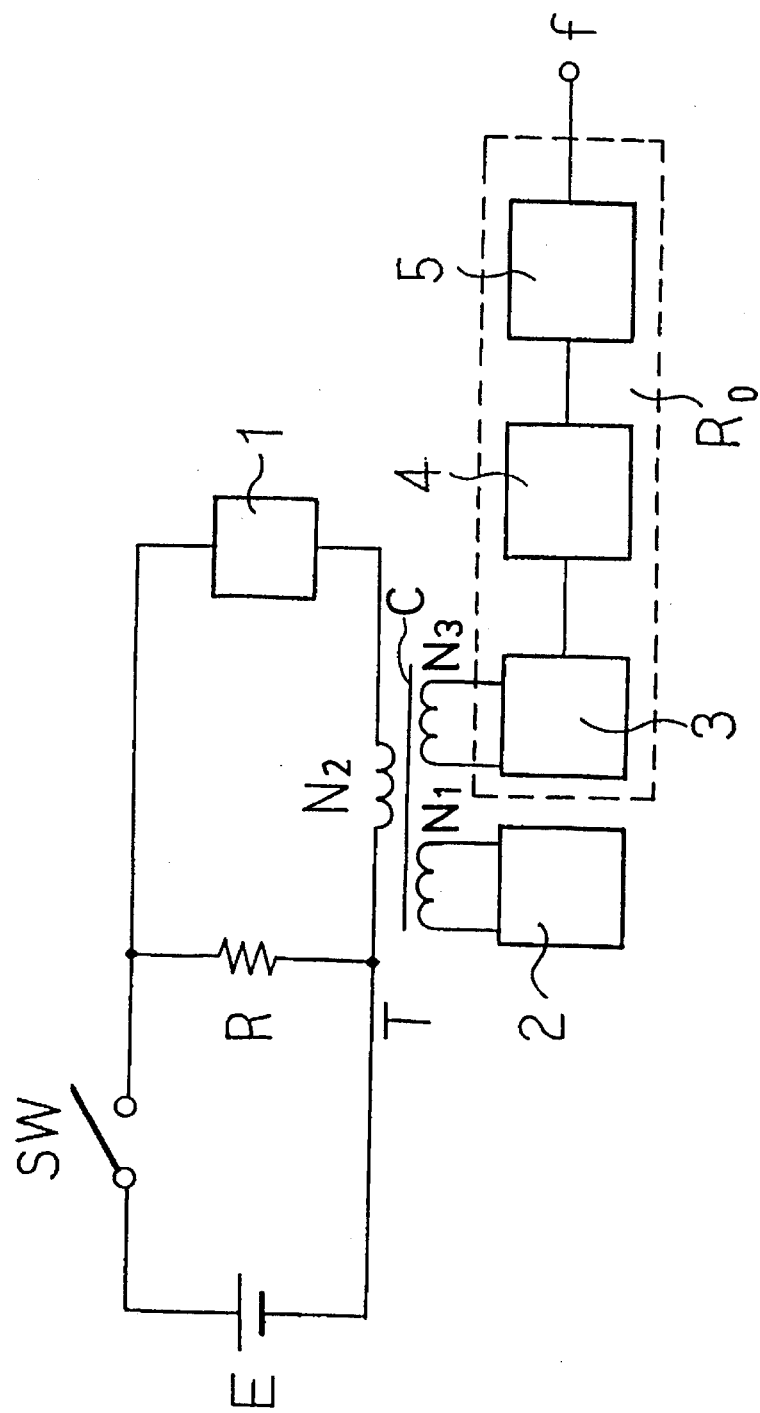
FIG. 1 is a circuit diagram of a conventional current sensor applied to sensing rotation of a motor.

Similarly, with the conventional construction shown in FIG. 1, if as described before a current flows in the winding N2 by way of the motor 1, then the saturable magnetic body core will become saturated. The output signal of the winding N3 will therefore drop considerably so that an output signal of "f" =0 is possible. However if in an extreme case a disconnection fault occurs in the resistor R, then even though the motor may still be rotating under inertia, since a current does not flow in the winding N2, the transformer T will not become saturated, so that the output signal of the winding N3 will not drop. As a result, the output signal "f" of the receiver 12 remains at f=1, the output condition for the motor stopped condition.

When however, as shown in FIG. 2 the two transformers T1, T2 are provided in separate current lines, with one transformer T1 being connected to the current line L having the resistor R therein and another transformer T2 being connected to the motor drive line, then in the event of a disconnection fault in the resistor R, the high frequency Signal will no longer be transmitted from the first transformer T1 to the second transformer T2. The output signal "f" of the receiver 12 will thus become f=0, the output signal for when the motor is rotating (ie. a signal indicating danger).

The fail-safe characteristics of the circuit structure of FIG. 1 will now be described.

When as described above, a disconnection fault occurs in the resistor R, the windings N02, N03, or the excitor windings of the motor, then the output signal for the winding N04 goes to zero. Needless to say if a disconnection fault occurs in the winding N01 or the winding N04 the output signal also goes to zero. A method wherein the alternating current amplifier 13 and an envelope detector for rectifying the output of the alternating current amplifier are used, so that in the event of a circuit fault the output signal goes to zero, is disclosed for example in; "Fail-Safe Circuit Design Know How", Transistor Technology February., 1985, PP 425–434 (CQ publishers). If as well as this known fail-safe level tester such as disclosed in U.S. Pat. No. 5,027,114, U.S. Pat. No. 4,661,880 or U.S. Pat. No. 4,757,417 is used for the level tester 15, then the output signal at the time of a fault can be made zero. The receiver 12 can thus be made fail-safe. Moreover, if for example a Schmitt circuit is used in the level tester 15 for level testing the output signal of the alternating current amplifier 13, then the envelope detector 14 becomes unnecessary. In this case, the output signal of the Schmitt circuit becomes a logic value of 1 when the alternating current output signal from the alternating current amplifier 13 is generated, and a logic value of zero when not generated.

The construction of the fail-safe alternating current amplifier will now be described briefly.

Normally, the transistor amplification level may be reduced due to a fault, but is not likely to be increased more than 30%. The output signal is thus fixed to a certain level unless the transistor amplifier will self oscillate at the time of a fault. In order to construct a fail-safe amplifier using an alternating current signal for the input signal, output of the alternating current signal as an output signal having a predetermined amplitude constitutes normal operation of the amplifier. This construction allows a fault in the amplifier to be distinguished from normal operation, because the level of the output signal becomes fixed at a certain value (level) and the output signal does not become an alternating current output signal. The condition on which this thinking is based is that the amplifier has a structure which does not self oscillate. Consequently, a negative feedback amplifier which is likely to self oscillate during a fault is not really suitable as a fail-safe amplifier. A negative feedback amplifier however has the advantage that the amplifying level is hardly changed with temperature.

Figure 4:
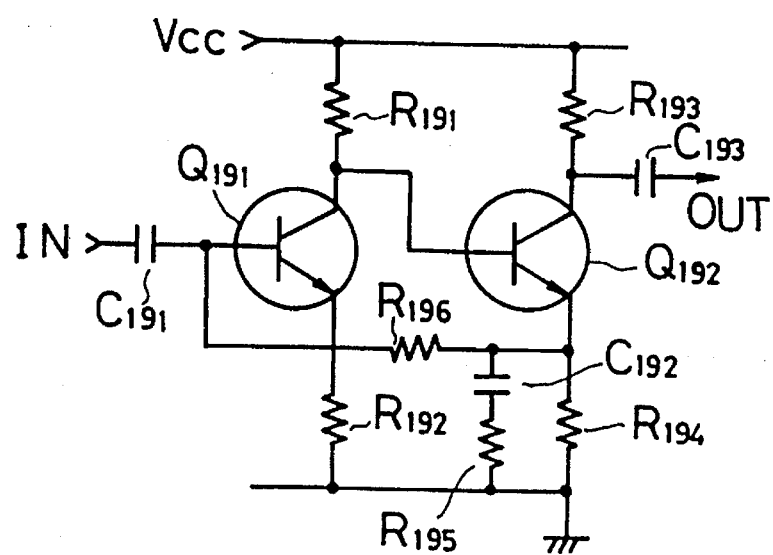
FIG. 4 is a circuit diagram of an alternating current amplifier applicable to the embodiment.

FIG. 4 shows an example of a fail-safe negative feedback amplifier (capable of amplification degree of approximately 30 dB).

In FIG. 4, symbols R191, R192, R913, R194, R195, R196 indicate resistors, C191, C192, C193 indicate capacitors, while Q191, Q192 indicate transistors. The output signal is feedback from the emitter side of the transistor Q192 through the resistor R196 to the base of the transistor Q191. In the circuit of FIG. 4, if a disconnection fault occurs in the resistors R191, R192, R193, R194, R196, the output signal of the transistor Q192 becomes fixed at either a high or low output level. Similar output conditions also result when a short circuit fault occurs in the capacitor C192, since this will change the base bias of the transistor Q191 considerably. When a disconnection fault occurs in the capacitor C192 and a disconnection fault occurs in the resistor R195, the amplification level drops and the amplitude of the output from the transistor Q192 is reduced. However, when such a fault occurs, then to fix the output signal of the transistor Q192 at a constant level, the construction can be that of FIG. 5.

Figure 5:
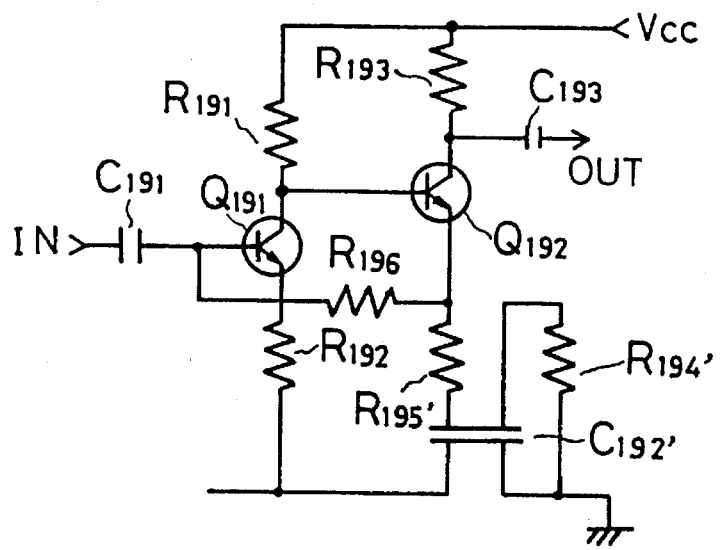
FIG. 5 is a different circuit diagram of an alternating current amplifier applicable to the embodiment.

In FIG. 5, with the exception of the resistors R194', R195', and the capacitor C192', the other elements are the same as those of FIG. 4.

In FIG. 4, the emitter resistance of the transistor Q192 with respect to the alternating current signal is the combined resistance of resistors R194 and R195 in parallel. The resistance of resistor R195'in FIG. 5 may be made approximately equal in size to this resistance. In FIG. 4, the emitter resistance of transistor Q192 with respect to a direct current signal is the resistance of resistor R194. In FIG. 5 the total resistance of resistors R195' and R194' may be made approximately equal to this size. In FIG. 5, a four terminal capacitor is used as the capacitor C192', so that even if a disconnection fault occurs in one of the resistors R194', R195', and even if a short circuit of disconnection fault occurs in the capacitor C192', the output signal of the transistor Q192 is fixed at the specific direct current level.

With such a construction, since when the amplified output from the alternating current amplifier 13 is fixed at a direct current level, the rectified output from the envelope detector 14 goes to zero, when the alternating current amplifier 13 is faulty, the output signal from the envelope detector 14 becomes zero.

With the current sensor having the two transformers provided separately in the above manner, then in the case of a disconnection fault occurring in the current line carrying the current to be detected, this fault can be reliably detected. A fail-safe current sensor thus becomes possible. Moreover, if this current sensor is used in a motor rotation sensor, then a fail-safe motor rotation sensor is possible wherein erroneous information due to a circuit fault of a rotation stopped condition is not produced when the motor is actually rotating. Furthermore, the motor rotation can be monitored without fitting a device for sensing, directly to the rotor of the motor or to the motor.

With the present embodiment a saturable magnetic core is used in both of the first and second transformers. However, it is clear that the use of a saturable magnetic body core in either the first transformer T1 or the second transformer T2, will be sufficient.

Moreover, with the present invention, the object to be monitored is the rotation of a motor. However in a case of a direct current solenoid instead of a motor, it will be apparent that the current during discharge of the accumulated energy in the windings can be monitored in a similar manner to that illustrated by FIG. 2.

Figure 6:
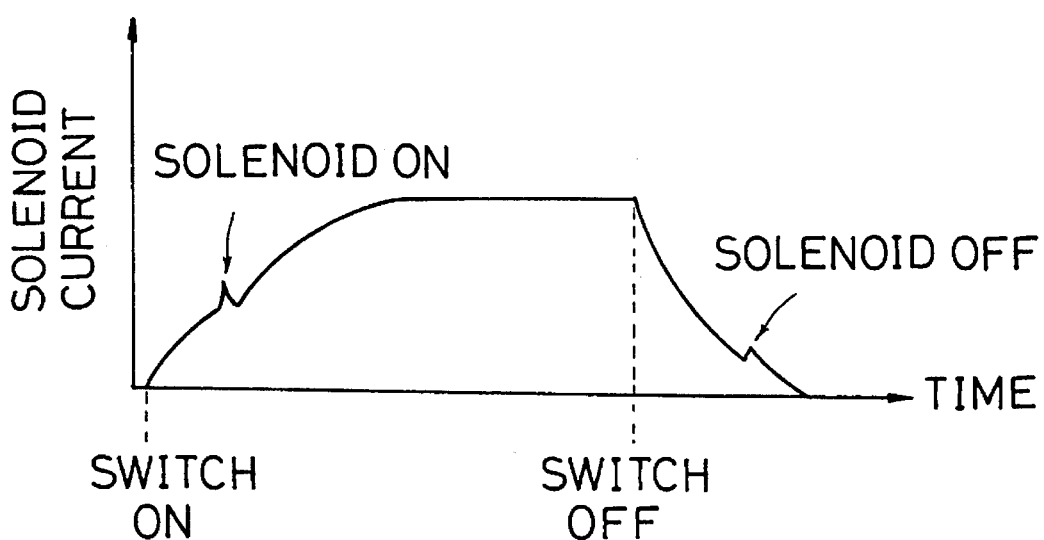
FIG. 6 is a diagram illustrating a solenoid current pattern which accompanies the switching of a switch SW, for a case wherein the motor of FIG. 2 is replaced with a direct current solenoid.

FIG. 6 shows a pattern of the current flowing in a solenoid in accordance with on/off switching, for the case where the motor of FIG. 2 is replaced with a direct current solenoid. As shown in FIG. 6, even when the switch SW is off, a current still flows from the solenoid. The present invention can thus be applied to monitoring this current.

INDUSTRIAL APPLICABILITY

The present invention can detect in a fail-safe manner the current flowing in a power line. It also enables fail-safe monitoring of motor rotation and the current in a solenoid, so that when using a driving mechanism of a motor or solenoid, extremely high safety can be maintained. The invention thus has considerable industrial applicability.

We claim:

1. A current sensor comprising:

a first transformer having a secondary side winding forming a portion of a current line through which current passes;

transmitting means for transmitting an alternating current signal to said current line via said first transformer;

a second transformer having a primary side winding forming a portion of a load drive line connected in parallel with said current line, at least one of the first and second transformers having a saturable magnetic core; and receiving means for receiving via said second transformer the alternating current signal transmitted from said transmitting means and generating output of logic value 1 when a level of the alternating current signal level is higher than a predetermined level, the output of logic value 1 indicating absence of load current.

2. A current sensor according to claim 1, wherein said receiving means generates output of logic value 0 during a fault condition.

3. A current sensor according to claim 2, wherein said receiving means comprises alternating current amplifying means for amplifying an alternating current signal transmitted to a secondary side winding of said second transformer from the primary side winding of said second transformer, said alternating current amplifying means generating output at a fixed level during the fault condition, and level testing means for generating the output of logic value 1 when output of the alternating current amplifying means is at a level higher than a predetermined threshold value and for generating the output of logic value 0 when said output of the alternating current amplifying means is less than the predetermined threshold value or during the fault condition.

4. A motor rotation sensor for a motor drive circuit including a series connected power source, motor, and a switch, said motor drive circuit supplying current to the motor when said switch is in an on position and having a current line in series with said switch and in parallel with said motor, said motor rotation sensor comprising:

a first transformer having a secondary side winding forming a portion of said current line;

transmitting means for transmitting an alternating current signal to said current line via said first transformer;

a second transformer having a primary side winding forming a portion of a motor drive line connected in parallel with said current line; and receiving means for receiving via said second transformer the alternating current signal transmitted from said transmitting means and generating an output signal of logic value 1 when a level of the alternating current signal is higher than a predetermined level, the output signal of logic value 1 indicating the motor is not rotating.

5. A motor rotation sensor according to claim 4, further comprising a resistor positioned in said current line in series with said first transformer.

* * * * *